(12) United States Patent
Lu et al.

(10) Patent No.: US 8,492,891 B2
(45) Date of Patent: Jul. 23, 2013

(54) CU PILLAR BUMP WITH ELECTROLYTIC METAL SIDEWALL PROTECTION

(75) Inventors: Wen-Hsiung Lu, Jhonghe (TW); Ming-Da Cheng, Jhubei (TW); Chih-Wei Lin, Xinfeng Township (TW); Jacky Chang, Zhubei (TW); Chung-Shi Liu, Shinchu (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 233 days.

(21) Appl. No.: 12/765,250

(22) Filed: Apr. 22, 2010

(65) Prior Publication Data

US 2011/0260317 A1    Oct. 27, 2011

(51) Int. Cl.
*H01L 23/48* (2006.01)

(52) U.S. Cl.
USPC ............ 257/737; 257/692; 257/E23.021; 257/E21.554; 438/613; 438/614

(58) Field of Classification Search
USPC ... 257/737, 692, E23.021, E21.554; 438/613, 438/614; 174/268; 427/443.2; 205/596
See application file for complete search history.

(56) References Cited

U.S. PATENT DOCUMENTS

| | | | |
|---|---|---|---|
| 6,627,824 B1* | 9/2003 | Lin ........................... | 174/268 |
| 6,681,982 B2 | 1/2004 | Tung | |
| 7,008,867 B2* | 3/2006 | Lei ............................ | 438/613 |
| 7,276,801 B2 | 10/2007 | Dubin et al. | |
| 7,435,325 B2 | 10/2008 | Shindo et al. | |
| 7,476,564 B2 | 1/2009 | Chen et al. | |
| 7,956,442 B2 | 6/2011 | Hsu et al. | |
| 2001/0012542 A1* | 8/2001 | Takahashi et al. ......... | 427/443.2 |
| 2001/0040290 A1* | 11/2001 | Sakurai et al. ............. | 257/737 |
| 2004/0069652 A1* | 4/2004 | Shindo et al. .............. | 205/596 |
| 2004/0166661 A1 | 8/2004 | Lei | |
| 2005/0032349 A1* | 2/2005 | Lee et al. .................... | 438/614 |
| 2006/0094226 A1 | 5/2006 | Huang et al. | |
| 2006/0244140 A1* | 11/2006 | Hu ............................. | 257/737 |
| 2007/0184579 A1 | 8/2007 | Huang et al. | |
| 2008/0048320 A1* | 2/2008 | Lee et al. .................... | 257/737 |
| 2008/0230896 A1 | 9/2008 | Zhong et al. | |
| 2009/0206476 A1* | 8/2009 | Su .............................. | 257/737 |
| 2009/0233436 A1 | 9/2009 | Kim et al. | |
| 2010/0109159 A1 | 5/2010 | Ho et al. | |
| 2011/0049706 A1 | 3/2011 | Huang et al. | |
| 2011/0233761 A1* | 9/2011 | Hwang et al. .............. | 257/737 |
| 2011/0260317 A1 | 10/2011 | Lu et al. | |
| 2011/0266667 A1* | 11/2011 | Wu et al. .................... | 257/737 |
| 2011/0278716 A1 | 11/2011 | Hsu et al. | |
| 2011/0285011 A1* | 11/2011 | Hwang et al. .............. | 257/737 |
| 2011/0298123 A1* | 12/2011 | Hwang et al. .............. | 257/737 |
| 2012/0007228 A1* | 1/2012 | Lu et al. ..................... | 257/692 |
| 2012/0280388 A1* | 11/2012 | Wu et al. .................... | 257/737 |

OTHER PUBLICATIONS

Islam, M. N., et al., "Comparative Study of the Dissolution Kinetics of Electrolytic Ni and Electroless Ni-P by the Molten Sn3.5Ag0.5Cu Solder Alloy", Microelectronics Reliability 343 (2003), pp. 2031-2037.
Office Action from corresponding application No. CN 201010250723.9.
Office Action dated May 9, 2013 from corresponding application No. TW 099125872.

* cited by examiner

*Primary Examiner* — Eugene Lee
*Assistant Examiner* — Fang-Xing Jiang
(74) *Attorney, Agent, or Firm* — Lowe Hauptman Ham & Berner, LLP

(57) ABSTRACT

A copper pillar bump has a sidewall protection layer formed of an electrolytic metal layer. The electrolytic metal layer is an electrolytic nickel layer, an electrolytic gold layer, and electrolytic copper layer, or an electrolytic silver layer.

20 Claims, 4 Drawing Sheets

CU PILLAR BUMP WITH ELECTROLYTIC METAL SIDEWALL PROTECTION

TECHNICAL FIELD

This disclosure relates to integrated circuit fabrication, and more particularly, to a bump structure in integrated circuit device.

BACKGROUND

Modern integrated circuits are made up of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Recently, copper pillar bump technology has been proposed. Instead of using a solder bump, the electronic component is connected to a substrate by means of a copper pillar bump, which achieves finer pitch with minimum probability of bump bridging, reduces the capacitance load for the circuits, and allows the electronic component to perform at higher frequencies. Cu pillar bump flip-chip assembly has the following advantages: (1) better thermal/electric performance, (2) higher current carrying capacity, (3) better resistance to electromigration, thus longer bump life, (4) minimizing molding voids—more consistence gaps between Cu pillar bumps. Also, a lower cost substrate is possible by using Cu-pillar controlled solder spreading, eliminating lead-free teardrop design.

Interaction and interdiffusion behavior between solder and copper gas been studied elsewhere. It is found that at the interface between tin-containing solder and copper, tin reacts rapidly with copper to form Cu—Sn intermetallic compounds (IMCs). The strength of the solder joint decreases with increasing thickness of IMC formed at the interface, causing bump cracks. Currently, a nickel cap layer is provided on the copper pillar bump for reducing the IMC thickness. However, the nickel cap layer causes the copper undercut after the UBM etching process, resulting in the nickel layer overhanging at the edge of the Cu pillar. This would cause stress-induce delamination failures at the interface between the solder joint and the Cu pillar.

In addition, copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low-K dielectric layers or to the solder used to bond the copper pillars to the substrate. A sidewall protection layer is therefore needed to prevent copper oxidation, but the conventional method of processing the Cu pillar sidewall suffers from high process costs and interface delamination issues. Currently, an immersion tin (Sn) process is employed to provide a tin layer on the Cu pillar sidewalls, but there are still concerns regarding process costs, adhesion between Sn and underfill, and issues of solder wetting onto sidewalls, which is a challenge for fine pitch package technology in new generation chips.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

Figure 1:
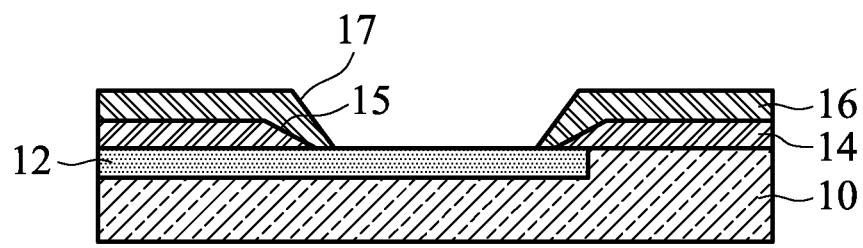
FIGS. 1-8 are cross-sectional diagrams depicting an exemplary embodiment of a method of forming a Cu pillar bump.

This disclosure provides embodiments of sidewall protection processes for Cu pillar bump technology, in which a protection layer on the sidewall of the Cu pillar bump is formed of a metallic layer formed by an electrolytic process, also referred to as an electrolytic metal layer in this disclosure. The Cu pillar bump may be applied directly on an electrical pad or a redistribution layer on a semiconductor chip for a flip chip assembly or other similar application.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present disclosure. It is to be understood that elements not specifically shown or described may take various forms. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, FIGS. 1-8 are cross-sectional views depicting an exemplary embodiment of a portion of a semiconductor device at stages in a Cu pillar bump process.

With reference to FIG. 1, an example of a semiconductor substrate 10 used for bump fabrication is employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices.

The substrate 10 further includes inter-layer dielectric layers (not shown) and a metallization structure (not shown) overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9. or less than about 2.8. Metal lines in the metallization structure may be formed of copper or copper alloys. One skilled in the art will realize the formation details of the metallization layers. A pad region 12 is a top metallization layer formed in a top-level inter-layer dielectric layer, which is a portion of conductive routes and has an exposed surface treated by a planarization process, such as chemical mechanical polishing (CMP), if necessary. Suitable materials for the pad region 12 may include, but are not limited to, for example copper (Cu), aluminum (Al), AlCu, copper alloy, or other mobile conductive materials. The pad region 12 is used in the bonding process to connect the integrated circuits in the respective chip to external features.

FIG. 1 also depicts a passivation layer 14 formed on the substrate 10 and patterned to form an opening 15 exposing a portion of the pad region 12 for allowing subsequent bump formation. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

FIG. 1 further depicts a polymer layer 16 formed on the passivation layer 14 and patterned to form an opening 17 exposing a portion of the pad region 12 for allowing subsequent bump formation. The opening 17 may be smaller than, equal to, or greater than the opening 15. In one embodiment, the opening 17 is positioned within the opening 15. The polymer layer 16 is formed of a polymer, such as an epoxy, polyimide, benzocyclobutene (BCB), polybenzoxazole (PBO), and the like, although other relatively soft, often organic, dielectric materials can also be used. In one embodiment, the polymer layer 16 is a polyimide layer. In another embodiment, the polymer layer 16 is a polybenzoxazole (PBO) layer. The polymer layer 16 is soft, and hence has the function of reducing inherent stresses on respective substrate. In addition, the polymer layer 16 is easily formed to thickness of tens of microns.

Figure 2:
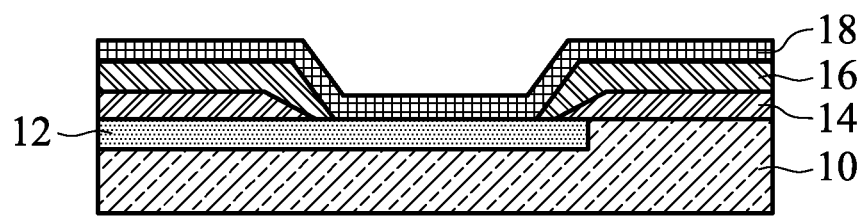

Referring to FIG. 2, the formation of an under-bump-metallurgy (UBM) layer 18 is performed on the resulted structure, which may be formed through any number of suitable techniques, including physical vapor deposition (PVD), chemical vapor deposition (CVD), electrochemical deposition (ECD), molecular beam epitaxy (MBE), atomic layer deposition (ALD), electroplating, and the like. In details, the UBM layer 18 is formed on the polymer layer 16 and the exposed portion of the pad region 12, and lines the sidewalls and bottom of the opening 17. The UBM layer 18 includes a diffusion barrier layer, which is formed of titanium, tantalum, titanium nitride, tantalum nitride, or the like. The diffusion barrier layer is deposited to a thickness of between about 500 and 2000 angstrom, for example, to a thickness of about 1000 Angstrom. The UBM layer 18 may further include a copper layer formed on the diffusion barrier layer. The copper may be formed of copper alloys that include silver, chromium, nickel, tin, gold, and combinations thereof. The copper layer is deposited to a thickness of between about 500 and 10000 angstrom, for example, to a thickness of about 5000 Angstrom.

Figure 3:
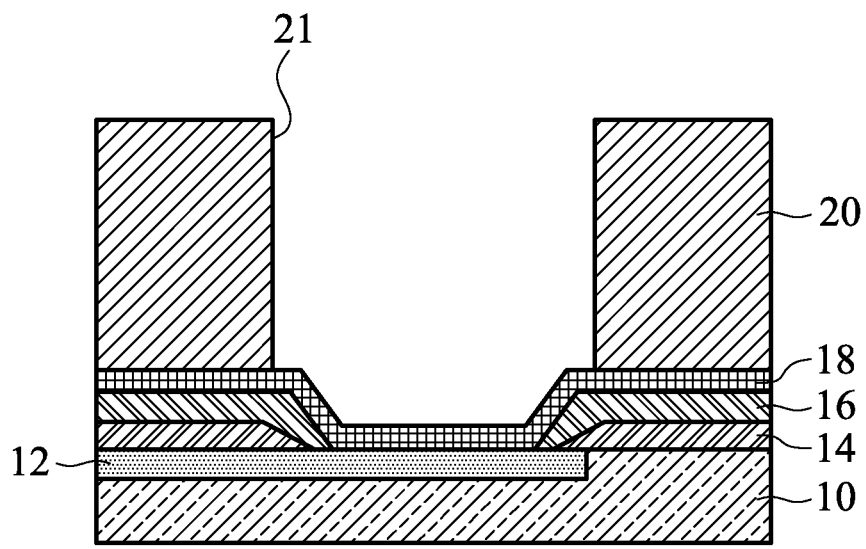

Next, referring to FIG. 3, for defining the bump window, a mask layer 20 is provided on the UBM layer 18 and patterned with an opening 21 exposing a portion of the UBM layer 18 for Cu pillar bump formation. The mask layer 20 may be a dry film or a photoresist film through the steps of coating, curing, descum and the like, followed by lithography technology and/or etching processes such as a dry etch and/or a wet etch process.

Figure 4:
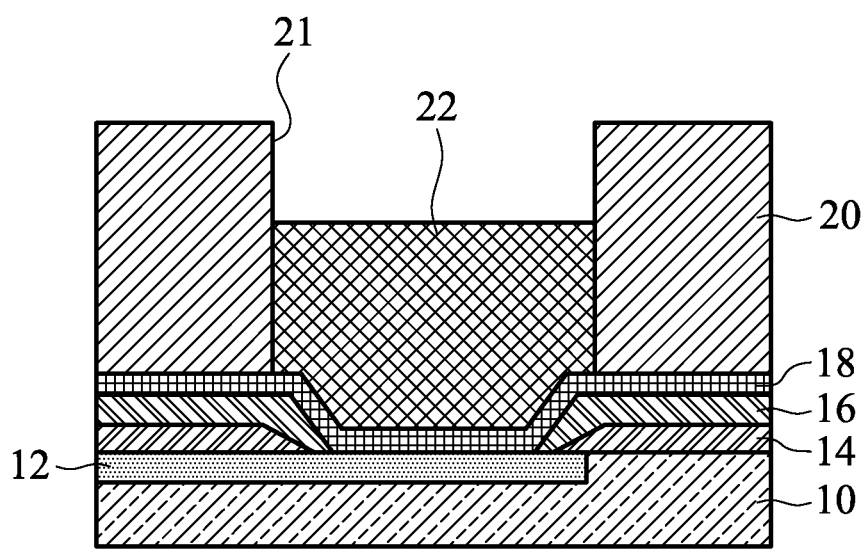

With reference to FIG. 4, the opening 21 is then partially or fully filled with a conductive material with solder wettability. In an embodiment, a copper (Cu) layer 22 is formed in the opening 21 to contact the underlying UBM layer 18. The Cu layer 22 is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 22. In an exemplary embodiment, the thickness of the Cu layer 22 is greater than 25 μm. In another exemplary embodiment, the thickness of the Cu layer 22 is greater than 40 μm. For example, the Cu layer 22 is of about 40-50 μm thickness, about 45 μm thickness, or about 40-70 μm thickness, although the thickness may be greater or smaller. The Cu layer 22 formed of a pillar (a post or a standoff), thereby is hereinafter referred to as Cu pillar 22.

Figure 5:
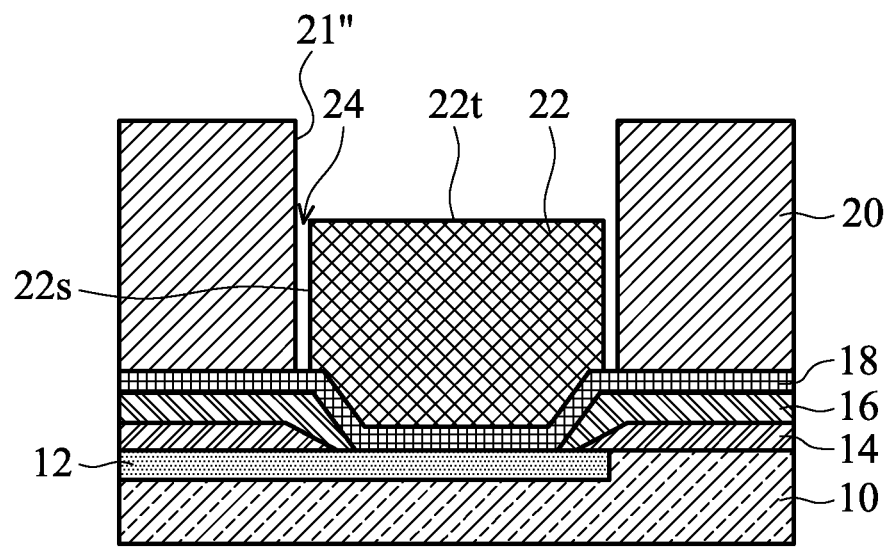

Then, a mask pullback process is performed as depicted in FIG. 5, which pulls the mask layer 20 back from the sidewalls 22s of the Cu pillar 22 to widen the opening 21, leaving a space 24 between the sidewall 22s of the Cu pillar 22 and the interior perimeter of the enlarged opening 21". The mask pullback process includes lithography technology and/or etching processes, which remove a portion of the mask layer 20.

Figure 6:
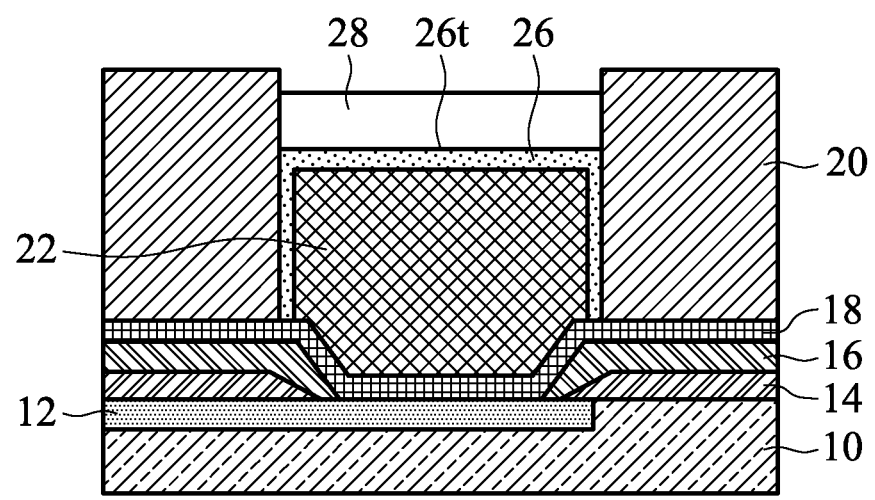

With reference to FIG. 6, a protection layer 26 is plated on the resulted structure by an electrolytic process. In details, the protection layer 26 covers the top surface 22t of the Cu pillar 22 to fills the space 24 between the sidewall surface 22s of the Cu pillar 22 and the mask layer 20. The protection layer 26 is a metal layer formed by an electroplating process from an electrolytic bath. The metal to be deposited is not particularly limited. The metal may be nickel (Ni), copper (Cu), silver (Ag), gold (Au), palladium (Pd), platinum (Pt), tin (Sn), zinc (Zn), a noble metal, or a combination of these. The electrolytic bath generally contains further components, which are required for performing the deposition method and for improving the quality of the deposited metal layer. These substances, for example, are grain-refining agents, wetting agents, brighteners, complexing agents and inhibitors. These organic and/or inorganic additives/components are more or less rapidly consumed, destroyed or removed from the bath when the deposition method is carried out. Thus, the concentration of the components decreases more or less rapidly in the course of time.

In one embodiment, the protection layer 26 is a nickel (Ni) layer through a nickel electroplating process that involves placing the object to nickel functioning as a cathode in an electrolytic bath. Some metal bars to be deposited are also placed in this bath, which are connected to the anode. Once supplied with voltage, the positive ions of the nickel to deposit migrate towards the negative pole where they are deposited forming a metallic layer. Main impurities of the produced nickel layer may include carbon (C), hydrogen (H) and/or sulfur (S) contents. The high purity nickel produced by this method has fewer impurities. The concentrations of the impurities are varied depending on the process control. The electrolytic Ni deposition contains a phosphorus (P) content of less than 0.01 wt % (weight percent).

In another embodiment, the protection layer 26 is a copper (Cu) layer through a copper electroplating process in an electrolytic bath with proprietary organic and/or inorganic additives. Main impurities of the produced Cu layer may include chlorine (Cl), sulfur (S), carbon (C) and/or oxygen (O) contents. The high purity copper produced by this method has fewer impurities. The concentrations of the impurities are varied depending on the process control. The electrolytic Cu deposition contains a sodium (Na) content of less than 0.01 wt %, and an iron (Fe) content of less than 0.01 wt %. In other embodiment, the protection layer 26 is a silver (Ag) layer through a silver electroplating process in an electrolytic bath with proprietary organic and/or inorganic additives. Main impurities of the produced silver layer may include potassium (K), carbon (C), oxygen (O) and/or nitrogen (N) contents. The electrolytic Ag deposition contains a sodium (Na) content of less than 0.01 wt %. In other embodiment, the protection layer 26 is a gold (Au) layer through a gold electroplating process in an electrolytic bath with proprietary organic and/or inorganic additives. Main impurities of the produced gold layer may include sulfur (S), titanium (Ti), sodium (Na), C, H, and/or O contents. The electrolytic Au deposition contains a potassium (K) content of less than 0.01 wt %, and a chlorine (Cl) content of less than 0.01 wt %.

After the formation of the protection layer 26, a cap layer 28 is optionally formed on the top surface 26t of the protection layer 26 within the enlarged opening 21". The cap layer 28 could act as a barrier layer to prevent copper in the Cu pillar 22 to diffuse into bonding material, such as solder alloy, that is used to bond the substrate 10 to external features. The prevention of copper diffusion increases the reliability and bonding strength of the package. The cap layer 28 may include gold (Au), tin, tin-lead (SnPb), silver, palladium (Pd), indium (In), nickel-palladium-gold (NiPdAu), nickel-gold (NiAu), other similar materials, or alloy by plating methods. The cap layer 28 has a thickness about 1~10 um. In some embodiments, the cap layer 28 is a multi-layers structure including Au, Pd, Ni-base alloy, Au-base alloy, or Pd-base alloy. In some embodiments, the cap layer 28 is a solder layer made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In some embodiments, the cap layer 28 is a multi-layers structure including a metal layer and a solder layer.

Figure 7:
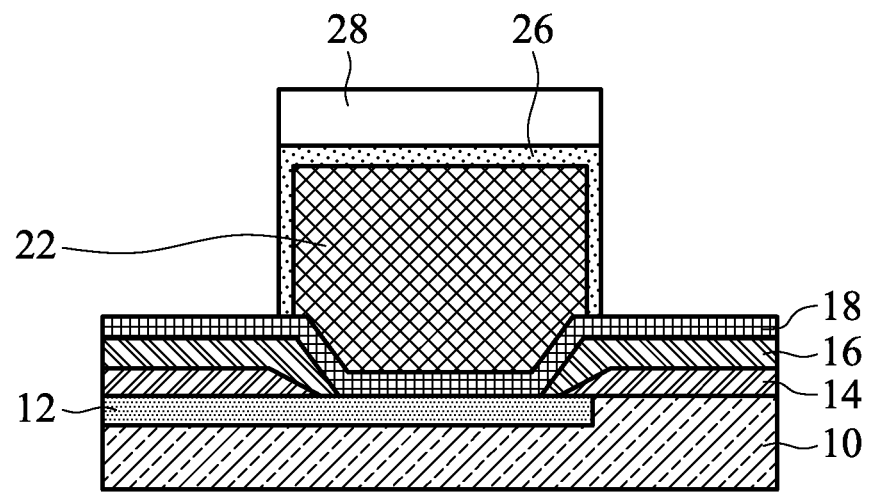

With reference to FIG. 7, the mask layer 20 is removed, exposing the metallization structure formed in the enlarged opening 21" and the underlying UBM layer 18. In the case the mask layer 20 is a dry film, it may be removed using an alkaline solution. If the mask layer 20 is formed of photoresist, it may be removed using acetone, n-methyl pyrrolidone (NMP), dimethyl sulfoxide (DMSO), aminoethoxy ethanol, and the like.

Figure 8:
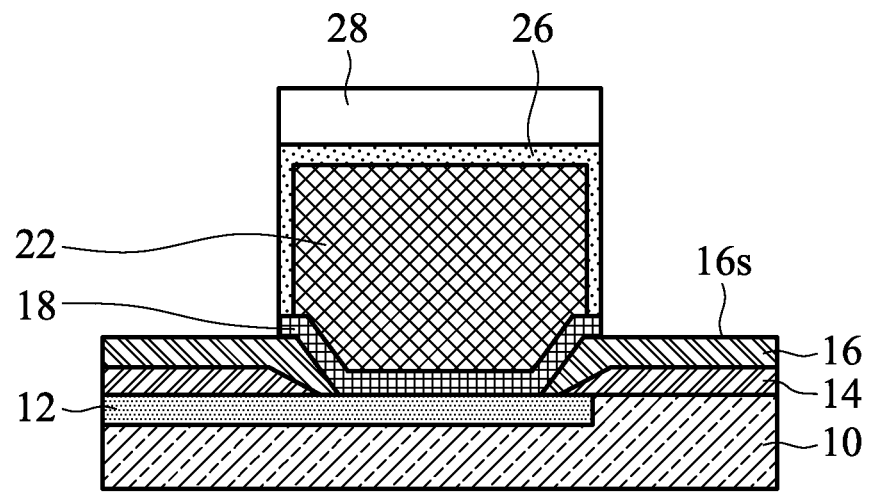

Then as shown in FIG. 8, using the metallization structure as a mask, the exposed portion of the UBM layer 18 is etched to expose a surface region 16s of the underlying polymer layer 16. In an exemplary embodiment, the step of etching the UBM layer 18 is a dry etching or a wet etching. For example, an isotropic wet etching (often referred to as flash etching due to its short duration) using an ammonia-based acid is employed, or a dry etching process, such as standard RIE procedure is employed. Thus the completed bump structure includes the UBM layer 18 formed on the metal pad region 12, the Cu pillar 22 formed on the UBM layer 18, the protection layer 26 on the top surface 22t and the sidewall surface 22s of the Cu pillar 22, and the optional cap layer 28 on the top surface 26t of the protection layer 26. Since the protection layer 26 is an electrolytic metal layer, ICP or SEM-EDX analysis can reveal that the content of a critical impurity in the protection layer 26 is very low (less than 0.01 wt %). The substrate 10 is then sawed and packaged onto a package substrate, or another die, with solder balls or Cu bumps mounted on a pad on the package substrate or the other die.

The disclosure provides a sidewall protection layer formed of an electrolytic-metal layer to prevent the Cu pillar sidewall from oxidation and increase adhesion between the Cu pillar sidewall and a subsequently formed underfill material. Compared with the conventional immersion Sn method followed by an annealing process, the electroplating method of forming the protection layer on the Cu pillar sidewall prior to the UBM etching step can save process costs, adjust film thickness easily by controlling the electroplating process time, prevent the undercut issues, and overcome the Ni overhanging scheme. Moreover, the bump structure can prohibit the stress from concentrating on some points, and thereby the problems of peeling or delamination from the Cu pillar sidewall are solved.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. An integrated circuit device, comprising:
a semiconductor substrate;
an under-bump-metallurgy (UBM) layer formed on the semiconductor substrate;

a copper pillar formed on the UBM layer and having a sidewall surface and a top surface;

a protection layer formed on the sidewall surface and the top surface of the copper pillar, the protection layer having exposed sidewalls; and a cap layer formed on the protection layer over the top surface of the copper pillar, wherein the protection layer is a nickel-containing layer comprising a phosphorus content of less than 0.01 weight percent.

2. The integrated circuit device of claim 1, wherein the nickel-containing layer comprises a sulfur (S) content.

3. The integrated circuit device of claim 1, wherein the cap layer is a gold-containing layer.

4. The integrated circuit device of claim 1, wherein the cap layer is a solder layer.

5. The integrated circuit device of claim 1, wherein the protection layer exposes sidewalls of the UBM layer.

6. An integrated circuit device, comprising:
a semiconductor substrate;
an under-bump-metallurgy (UBM) layer formed on the semiconductor substrate;
a conductive pillar formed on the UBM layer and having a sidewall surface and a top surface;
a protection layer formed on the sidewall surface and the top surface of the conductive pillar; and
a cap layer formed on the protection layer over the top surface of the conductive pillar and exposing sidewalls of the protection layer,
wherein the protection layer is an electrolytic metal layer.

7. The integrated circuit device of claim 6, wherein the protection layer is an electrolytic nickel layer.

8. The integrated circuit device of claim 6, wherein the protection layer is an electrolytic gold layer.

9. The integrated circuit device of claim 6, wherein the protection layer is an electrolytic copper layer.

10. The integrated circuit device of claim 6, wherein the protection layer is an electrolytic silver layer.

11. The integrated circuit device of claim 6, wherein the conductive pillar has a thickness greater than 25 μm.

12. The integrated circuit device of claim 6, wherein the cap layer is a gold-containing layer.

13. The integrated circuit device of claim 6, wherein the cap layer is a solder layer.

14. The integrated circuit device of claim 6, wherein the conductive pillar is a copper pillar.

15. An integrated circuit device, comprising:
a semiconductor substrate;
an under-bump-metallurgy (UBM) layer formed on the semiconductor substrate;
a copper pillar formed on the UBM layer and having a sidewall surface and a top surface;
a protection layer formed on the sidewall surface and the top surface of the copper pillar; and
a cap layer formed on the top surface of the copper pillar, wherein an exterior sidewall of the cap layer is aligned with an exterior sidewall of the UBM layer and an exterior sidewall of the protection layer.

16. The integrated circuit device of claim 15, wherein the cap layer exposes sidewalls of protection layer.

17. The integrated circuit device of claim 15, wherein the copper pillar further includes a bottom surface, the bottom surface having a width less than a width of the top surface.

18. The integrated circuit device of claim 15, wherein the UBM layer comprises:
a diffusion barrier layer formed on the semiconductor substrate; and
a copper layer formed on the diffusion barrier layer.

19. The integrated circuit device of claim 15, wherein the cap layer comprises multiple layers.

20. The integrated circuit device of claim 15, wherein a distance from the exterior sidewall of the protection layer and an exterior sidewall of the copper pillar in a direction parallel to the top surface is substantially constant.

* * * * *